United States Patent [19]

Ogasawara et al.

[11] Patent Number: 5,044,073

[45] Date of Patent: Sep. 3, 1991

[54] PROCESS FOR PRODUCING PRINTED-CIRCUIT BOARD

[75] Inventors: Shuichi Ogasawara, Ichikawa; Kazuo Kawanishi, Chiba, both of Japan

[73] Assignee: Sumitomo Metal Mining Company Limited, Tokyo, Japan

[21] Appl. No.: 624,539

[22] Filed: Dec. 10, 1990

Related U.S. Application Data

[63] Continuation of Ser. No. 298,696, Jan. 19, 1989, abandoned.

[30] Foreign Application Priority Data

Nov. 26, 1988 [JP] Japan ................................. 63-297218

[51] Int. Cl.$^5$ ............................................. H05K 3/12
[52] U.S. Cl. ...................................... 29/846; 156/651; 156/655; 427/98
[58] Field of Search ........................... 29/848, 846, 825; 156/651, 655, 901, 902; 427/98

[56] References Cited

U.S. PATENT DOCUMENTS

| | | | |
|---|---|---|---|
| 3,455,751 | 7/1969 | Frantzen | 156/651 K |
| 3,620,933 | 11/1971 | Grunwald | 427/98 X |
| 3,871,930 | 3/1975 | Fish | 156/655 X |
| 4,039,371 | 8/1977 | Brunner et al. | 156/655 X |
| 4,232,060 | 11/1980 | Mallory, Jr. | 427/98 |
| 4,298,424 | 11/1981 | Terada et al. | 156/655 X |
| 4,611,417 | 3/1987 | Schumacher, III et al. | 29/848 |
| 4,770,899 | 9/1988 | Zeller | 427/98 X |

FOREIGN PATENT DOCUMENTS 56-44597 10/1981 Japan.

OTHER PUBLICATIONS

IBM Tech. Discl. Bull. vol. 20, No. 2, Jul. 1977, pp. 525-526 by H. C. Cook et al.

*Primary Examiner*—Carl J. Arbes
*Attorney, Agent, or Firm*—Watson, Cole, Grindle and Watson

[57] ABSTRACT

Disclosed herein is a process which makes it possible to greatly improve the insulation resistance between conductors on a printed-circuit board having a layer formed by electroless copper plating, and hence it provides a printed circuit board with extremely high reliability. According to the process, a printed-circuit board is formed by forming a metal coating film on a resin board by electroless plating after activation, etching the metal coating film, thereby forming printed conductors, and etching at least the exposed surface of the resin board which is not covered by the printed conductors.

10 Claims, No Drawings

PROCESS FOR PRODUCING PRINTED-CIRCUIT BOARD

This application is a continuation of application Ser. No. 298,696, filed Jan. 19, 1989, now abandoned.

BACKGROUND OF THE INVENTION

1. Field of the Invention

The present invention relates to a process for producing a printed-circuit board from a metal-coated resin board by the aid of electroless plating.

2. Description of the Prior Art

According to the generally accepted conventional practice, flexible printed boards and tape automated bonding (TAB) boards are produced by forming printed conductors on a copper-coated resin film by etching. The copper coated resin film is composed of an insulating film of polyimide resin or the like and a copper foil bonded to it with an adhesive of epoxy resin or the like. The etching of the copper coating is accomplished by photoetching or by chemical etching which involves the steps of forming a protective coating on the copper coating by screen printing and removing those parts of copper coating not covered by the protective coating. A disadvantage of the conventional process is that the adhesive is usually inferior in chemical resistance to polyimide. It absorbs impurities such as chlorine ions while the printed conductors are being formed and it retains them even after washing. This often leads to the incomplete insulation of printed conductors, especially in the case of dense printed conductors.

To overcome this disadvantage, there was proposed a process for forming a copper coating directly on the resin board without using any adhesive, as disclosed in Japanese Patent Publication No. 44597/1981. According to this process, printed conductors are formed by the steps of forming a first thin copper layer by electroless plating, applying a photoresist to the copper layer, exposing the photoresist through a desired pattern, developing the photoresist, forming a second copper layer on the exposed part of the first copper layer by electrolytic plating until a desired thickness is reached, removing the photoresist, and etching the entire copper coating until the first copper layer is removed.

The above-mentioned process, however, still has a drawback resulting from the use of a chemical for catalyst activation. (Electroless plating needs a pretreatment with palladium or the like to activate the catalyst.) Part of the chemical used for catalyst activation remains unremoved in the subsequent steps, adversely affecting the insulation of printed conductors.

SUMMARY OF THE INVENTION

It is an object of the present invention to provide a process for producing a highly reliable printed-circuit board which is free of incomplete insulation resulting from the pretreatment for electroless copper plating.

DETAILED DESCRIPTION OF THE INVENTION

The first aspect of the present invention resides in a process for producing a printed-circuit board which comprises forming a metal coating film on a resin board by electroless plating after activation, etching the metal coating film, thereby forming printed conductors, and etching at least the exposed surface of the resin board which is not covered by the printed conductors.

The second aspect of the present invention resides in a process for producing a printed-circuit board which comprises forming a first metal coating film on a resin board by electroless plating after activation, forming a second metal coating film by electroless plating, etching the two metal coating films, thereby forming printed conductors, and etching at least the exposed surface of the resin board which is not covered by the printed wires.

The third aspect of the present invention resides in a process for producing a printed-circuit board which comprises forming a first metal coating film on a resin board by electroless plating after activation, applying a photoresist to the metal coating film, exposing the photoresist through a mask having the pattern of printed conductors, developing the photoresist, forming a second metal coating film by electrolytic plating on the exposed part of the first metal coating film, removing the photoresist, etching the entire surface of the metal coating films until the first metal coating film is removed to form printed conductors, and etching at least the exposed surface of the resin board which is not covered by the printed conductors.

The fourth aspect of the present invention resides in a process for producing a printed-circuit board which comprises applying a photoresist to a resin board after activation, exposing the photoresist through a mask having the pattern of printed conductors, developing the photoresist, forming a metal coating film by electroless plating on the exposed part of the resin board, thereby forming printed conductors, removing the photoresist, and etching at least the exposed surface of the resin board which is not covered by the printed conductors.

The fifth aspect of the present invention resides in a process for producing a printed-circuit board which comprises applying a photoresist to a resin board after activation, exposing the photoresist through a mask having the pattern of printed conductors, developing the photoresist, forming a first metal coating film by electroless plating on the exposed part of the resin board, thereby forming printed conductors, forming a second metal coating film by electrolytic plating on the first metal coating film, removing the photoresist, and etching at least the exposed surface of the resin board which is not covered by the printed conductors.

The above-mentioned first to fifth aspects of the present invention are characterized by the final step of etching that part of the resin board surface which is not covered by the printed conductors. This etching dissolves a thin surface layer of the resin board and removes residual chemicals from the resin board. This etching can be accomplished by the aid of any solvent which dissolves the resin board. Solvents suitable for polyimide resin boards are hydrazine, ethylene diamine, dioxane, alcohol, and aqueous solution of alkali hydroxide. The method for this etching is not specifically limited so long as it permits the dissolution of that part of the resin board surface which is not covered by the printed conductors. Thus the etching may be performed by treating the printed-circuit board on which are formed the printed conductors with a solvent by dipping or spraying. This etching takes 2 seconds or more, although the exact time varies depending on the concentration and temperature of the solvent used.

The above-mentioned fourth and fifth aspects of the present invention are characterized by the activation treatment which is performed before the application of a photoresist. Such activation treatment eliminates drawbacks in the activation treatment which is performed after the application of a photoresist. In the latter case, the photoresist is contaminated with the catalyst metal, which permits a metal coating film to be formed on the photoresist in the subsequent steps.

EXAMPLE

A polyimide resin board, 15 mm×20 mm×125 μm, with one side covered with an adhesive tape, was dipped in hydrazine hydrate for 2 minutes for surface roughening, followed by water rinsing. Then, the resin board was dipped in OPC-80 (made by Okuno Seiyaku K. K.) for 6 minutes for catalyzing treatment, followed by water rinsing. The resin board was further dipped in OPC-555 (made by Okuno Seiyaku K. K.) for 8 minutes for accelerating treatment, followed by water rinsing. The resin board was dipped in an electroless plating solution (containing copper sulfate 10 g/L, EDTA 24 g/L, formalin 5 ml/L, polyethylene glycol (#1000) 0.5 g/L, and dipyridyl 10 mg/L; pH 12.5) at 60° C. for 10 minutes. Thus, there was formed a copper coating film about 0.3 μm thick. To the copper coating film was applied a photoresist. The photoresist was exposed through a mask having square patterns, 1 mm×10 mm, arranged in two rows at intervals of 0.2 mm. After development, the exposed part of the copper coating film of-electroless plating was subjected to electrolytic copper plating to form an approximately 35 μm thick copper coating film. The photoresist was removed. The entire copper coating film was subjected to etching until the copper coating film formed by electroless plating was completely removed. Thus the copper coating film of conductor pattern was formed on the polyimide resin board.

The resin board was dipped in hydrazine hydrate for 3 seconds for etching, followed by water rinsing. The insulation resistance between the conductors was $3.6 \times 10^{12}$ Ω at DC 10 V. In the case of a comparative sample without resin etching, the insulation resistance was $2.2 \times 10^8$ Ω. It is noted that the insulation resistance is greatly improved in the case where the process of the present invention is employed.

To see the effect of etching with hydrazine hydrate, the composition of the resin surface was examined by Auger spectrochemical analysis before and after etching. The results (element concentrations) are shown in Table 1.

TABLE 1

|  | Before etching | After etching |
| --- | --- | --- |
| Carbon | 67.5 | 71.5 |
| Nitrogen | 8.3 | 15.4 |
| Oxygen | 7.6 | 12.0 |
| Chlorine | 15.3 | 0.0 |
| Palladium | 1.3 | 1.1 |

It is noted from Table 1 that chlorine is completely removed by the etching and the removal of chlorine leads to the improvement of insulation resistance.

As mentioned above, the process of the present invention makes it possible to greatly improve the insulation resistance between the conductors on the printed-circuit board having a layer formed by electroless copper plating, and hence it provides a printed circuit board with extremely high reliability.

What is claimed is:

1. A process for producing a printed-circuit board which consists essentially of forming a metal coating film on a polyimide resin board by electroless plating after activation, etching the metal coating film, thereby forming printed conductors, and lastly etching at least the exposed surface of the resin board which is not covered by the printed conductors with a solvent selected from the group consisting of hydrazine, ethylenediamine, dioxane, alcohol, and aqueous solution of alkali hydroxide.

2. A process as claimed in claim 1, wherein the etching in the last step is performed for 2 seconds or more.

3. A process for producing a printed-circuit board which consists essentially of forming a first metal coating film on a polyimide resin board by electroless plating after activation, forming a second metal coating film by electroless plating, etching the two metal coating films, thereby forming printed conductors, and lastly etching at least the exposed surface of the resin board which is not covered by the printed conductors with a solvent selected from the group consisting of hydrazine, ethylenediamine, dioxane, alcohol, and aqueous solution of alkali hydroxide.

4. A process as claimed in claim 3 wherein the etching in the last step is performed for 2 seconds or more.

5. A process for producing a printed-circuit board which consists essentially of forming a first metal coating film on a polyimide resin board by electroless plating after activation applying a photoresist to the first metal coating film, exposing the photoresist through a mask having the pattern of printed conductors, developing the photoresist, forming a second metal coating film by electrolytic plating on the exposed part of the first metal coating film, removing the photoresist, and etching the entire surface of the metal coating films until the first metal coating film is removed, thereby forming printed conductors, and lastly etching at least the exposed surface of the resin board which is not covered by the printed conductors with solvent selected from the group consisting of hydrazine, ethylenediamine, dioxane, alcohol, and aqueous solution of alkali hydroxide.

6. A process as claimed in claim 5, wherein the etching in the last step is performed for 2 seconds or more.

7. A process for producing a printed-circuit board which consists essentially of applying a photoresist to a polyimide resin board after activation, exposing the photoresist through a mask having the pattern of printed conductors, developing the photoresist, forming a metal coating film by electroless plating on the exposed part of the resin board, thereby forming printed conductors, removing the photoresist, and lastly etching at least the exposed surface of the resin board which is not covered by the printed conductors with a solvent selected from the group consisting of hydrazine, ethylenediamine, dioxane, alcohol, and aqueous solution of alkali hydroxide.

8. A process as claimed in claim 7, wherein the etching in the last step is performed for 2 seconds or more.

9. A process for producing a printed-circuit board which consists essentially of applying a photoresist to a polyimide resin board after activation, exposing the photoresist through a mask having the pattern of printed conductors, developing the photoresist, forming a first metal coating film by electroless plating on the exposed part of the resin board, thereby forming printed conductors, forming a second metal coating film by electrolytic plating on the first metal coating film, removing the photoresist, and lastly etching at least the exposed surface of the resin board which is not covered by the printed conductors with a solvent selected from the group consisting of hydrazine, ethylenediamine, dioxane, alcohol, and aqueous solution of alkali hydroxide.

10. A process as claimed in claim 9 wherein the etching in the last step is performed for 2 seconds or more.

* * * * *